United States Patent [19]
Beam, III et al.

[11] Patent Number: 5,952,059
[45] Date of Patent: Sep. 14, 1999

[54] FORMING A PIEZOELECTRIC LAYER WITH IMPROVED TEXTURE

[75] Inventors: Edward A. Beam, III, Dallas; Andrew J. Purdes, Garland, both of Tex.

[73] Assignee: Texas Instruments Incorporated, Dallas, Tex.

[21] Appl. No.: 08/947,846

[22] Filed: Oct. 9, 1997

Related U.S. Application Data

[60] Provisional application No. 60/028,989, Oct. 23, 1996.

[51] Int. Cl.$^6$ .................................................. C23C 16/34
[52] U.S. Cl. .......................... 427/562; 427/100; 427/564; 427/576; 427/255.2
[58] Field of Search ................................ 427/100, 126.3, 427/562, 564, 576, 255.2, 255.3

[56] References Cited

U.S. PATENT DOCUMENTS 3,655,429  4/1972  Deklerk ................................... 427/100

FOREIGN PATENT DOCUMENTS 54-103791  8/1979  Japan .
55-50462   4/1980  Japan .

OTHER PUBLICATIONS

Wauk et al., Applied Physics Letters, vol. 13, No. 8, pp. 286–288, Oct. 1968.

*Primary Examiner*—Shrive Beck
*Assistant Examiner*—Timothy Meeks
*Attorney, Agent, or Firm*—Mark A. Valetti; Carlton H. Hoel; Richard L. Donaldson

[57] ABSTRACT

A method is provided for forming a piezoelectric layer with improved texture. In the method, a metallic material is evaporated. A noble gas is combined with a reactant gas. An atomic reactant gas flow is generated from the combined gas using a plasma source. The atomic reactant gas flow is introduced to the evaporated metallic material in the presence of a substrate under molecular flow pressure conditions to form a piezoelectric layer with improved texture on the surface of the substrate.

9 Claims, 1 Drawing Sheet

FORMING A PIEZOELECTRIC LAYER WITH IMPROVED TEXTURE

RELATED PATENT APPLICATION

This application is related to copending U.S. Provisional Application Ser. No. 60/028,989, Attorney s Docket No. TI-20208P, filed on Oct. 23, 1996 by Edward A. Beam III, et al. and entitled Method of Forming a Piezoelectric Layer With Improved Texture.

TECHNICAL FIELD OF THE INVENTION

This invention relates generally to the field of electronic device fabrication, and more particularly, to forming a piezoelectric layer with improved texture.

BACKGROUND OF THE INVENTION

Piezoelectric materials, such as aluminum nitride and zinc oxide, can be formed as layers on a substrate structure. These piezoelectric layers may be incorporated into electronic applications, such as thin film resonator filters. In order for such resonator filters to function properly, the piezoelectric layers must possess a strong C-axis or (001) polycrystalline orientation or texture normal to a substrate plane. From a manufacturing standpoint, it is desirable to form such piezoelectric layers using high deposition rate processes.

Previously, conventional sputtering techniques were used to form piezoelectric layers. According to such techniques, piezoelectric material was typically deposited at a low deposition rate upon a substrate. Conventional sputtering techniques, however, have limited process space, thus resulting in piezoelectric layers having poor (001) polycrystalline texture when deposited at high deposition rates.

More recently, conventional chemical vapor deposition and plasma-assisted ultra high vacuum chemical vapor deposition techniques have been utilized to form piezoelectric layers. Conventional chemical vapor deposition techniques are known to one of ordinary skill in the art. Plasma-assisted ultra high vacuum chemical vapor deposition is a variant of conventional chemical vapor deposition in which deposition occurs at very low pressures. The low deposition pressures promote molecular flow conditions in a reactor so that chemical reactions occur directly on a substrate surface, not in a gas phase. A variety of source material constituents, such as gases or organometallic vapors, can be used in a plasma-assisted ultra high vacuum chemical vapor deposition technique. These source material constituents can be subjected to various processes, such as direct injection, evaporation, and plasma or thermal decomposition or pre-cracking. Like the conventional sputtering techniques, however, the conventional chemical vapor deposition and plasma-assisted ultra high vacuum techniques produced piezoelectric layers with poor (001) texture at high deposition rates.

SUMMARY OF THE INVENTION

In accordance with the present invention, the disadvantages and problems associated with previous techniques for forming a piezoelectric layer have been substantially reduced or eliminated.

According to an embodiment of the present invention, a method is provided for forming a piezoelectric layer with improved texture. In the method, a metallic material is evaporated. A noble gas is combined with a reactant gas. An atomic reactant gas flow is generated from the combined gas using a plasma source. The atomic reactant gas flow is introduced to the evaporated metallic material in the presence of a substrate under molecular flow pressure conditions to form a piezoelectric layer with improved texture.

According to another embodiment of the present invention, a system is provided for forming a piezoelectric layer with improved texture. The system includes a reactant gas source, which contains a reactant gas, and a noble gas source, which contains a noble gas. A plasma source, such as an electron cyclotron resonance (ECR) source, is coupled to the reactant gas source and the noble gas source for receiving the reactant and noble gases. The plasma source decomposes the reactant gas to produce an atomic reactant gas flow. An effusion cell evaporates a metallic material. A reactor chamber, in fluid communication with the plasma source, houses the effusion cell. The reactor chamber can contain a reaction whereby a piezoelectric layer having improved texture is formed on a substrate by the introduction of the atomic reactant gas flow to the evaporated metallic material.

The present invention provides various technical advantages over prior techniques for forming piezoelectric layers. One technical advantage includes combining a noble gas, preferably in a relatively small amount, with a reactant gas to produce a stream of combined gas. A plasma source is used to generate an atomic gas flow from the combined gas. The atomic gas flow is introduced to an evaporated metallic material in the presence of a substrate under molecular flow pressure conditions, thereby causing a piezoelectric layer having improved texture to form on the substrate. This formation may occur at a high deposition rate, such as in the range of 500–5000 nanometers per hour. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
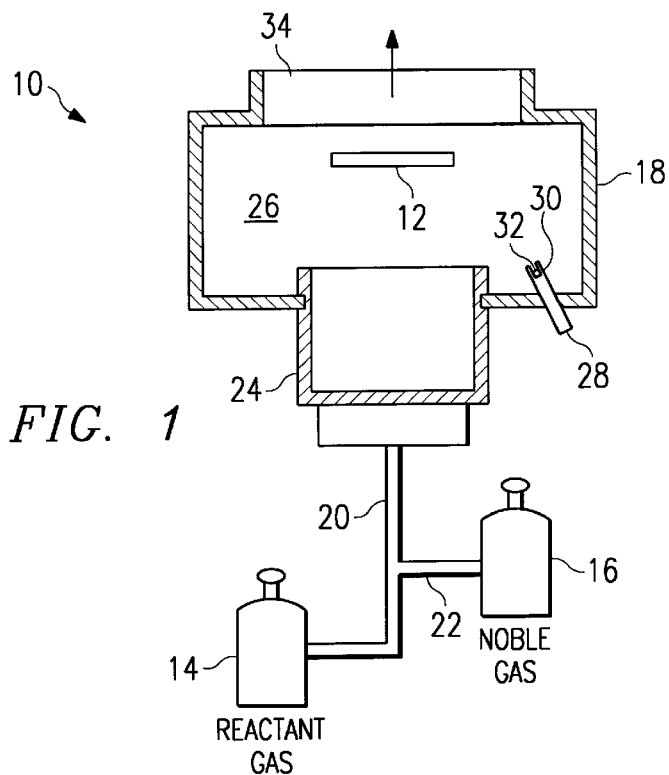
FIG. 1 illustrates a system for forming a piezoelectric layer with improved texture according to an embodiment of the present invention.
Figure 2:
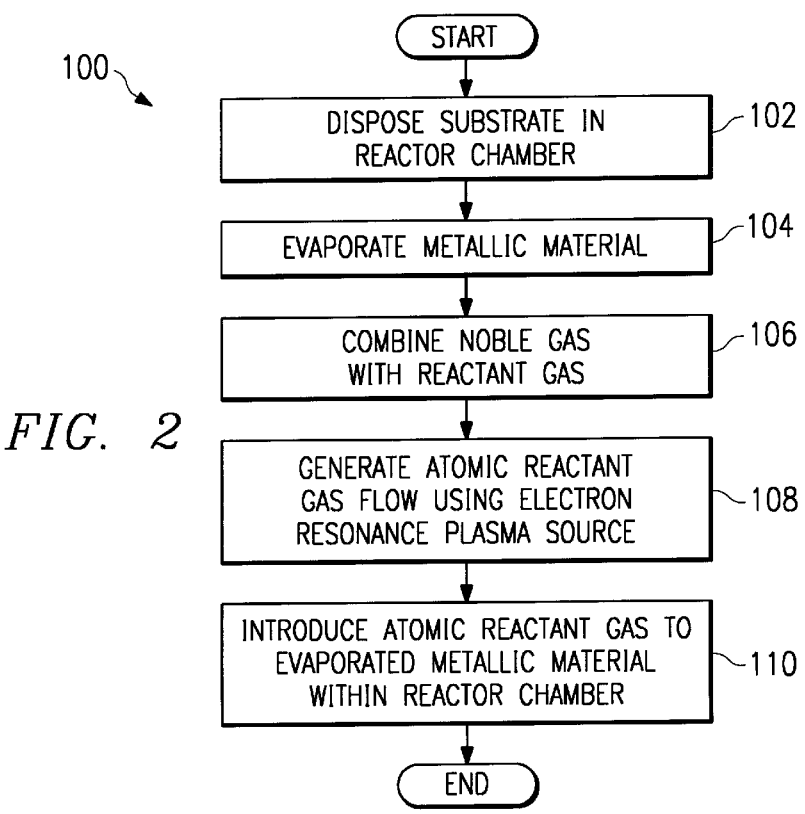
FIG. 2 is a flow diagram of a method for forming a piezoelectric layer with improved texture according to an embodiment of the present invention.

The preferred embodiment of the present invention and its advantages are best understood by referring to FIGS. 1 and 2 of the drawings, like numerals being used for like and corresponding parts of the various drawings.

FIG. 1 illustrates a system 10 for forming a piezoelectric layer with improved texture on a substrate 12 according to an embodiment of the present invention. System 10 includes a reactant gas source 14, a noble gas source 16, and a reactor 18.

Substrate 12 may comprise any suitable substrate material, such as silicon, gallium arsenide, or sapphire. Substrate 12 may comprise a production wafer. Substrate 12 can have an amorphous structure, or alternatively, a single crystalline or polycrystalline orientation or texture. Furthermore, substrate 12 may have one or more layers of material previously formed thereon, such as an insulating layer or a conducting layer. An insulating layer may comprise silicon dioxide or similar insulating material. A conducting layer may be formed as a metal film, which comprises aluminum, gold, or any other suitable conducting material.

Reactant gas source 14 may contain any suitable reactant gas, such as nitrogen or oxygen. The reactant gas contained within reactant gas source 14 may be in molecular form. For example, nitrogen may be in the form of nitrogen gas molecules (i.e., $N_2$), and oxygen can be in the form of oxygen molecules (i.e., $O_2$). Reactant gas source 14 may be connected to reactor 18 via a line 20. Noble gas source 16 can contain any suitable gas from the noble gas group for combination with the reactant gas contained in reactant gas source 14. For example, noble gas source 16 may contain argon. The noble gas functions to enhance the formation of piezoelectric layers having improved (001) texture, as described below in more detail. Noble gas source 16 is coupled to line 20 via a line 22.

Reactor 18 generally functions to deposit layers upon a substrate 12 contained therein. Reactor 18 comprises plasma source 24, a reactor chamber 26, and an effusion cell 28. Plasma source 24 is connected to line 20. In one embodiment, plasma source 24 may comprise an electron cyclotron resonance (ECR) plasma source. Preferably, plasma source 24 is operated in a relatively low pressure system such that molecular flow conditions prevail. Plasma source 24 may utilize a plasma to crack or decompose a molecular gas into atomic gas. Plasma source 24 may output a gas flow comprised of elemental reactant gas in atomic form and various ionized particles.

Reactor chamber 26 is in fluid communication with plasma source 24. Reactor chamber 26 can contain a high vacuum pumping system. A reaction wherein layers are deposited upon substrate 12 may occur within reactor chamber 26. Such reaction may occur at a relatively low pressure, such as within a range of $10^{-7}$ to $10^{-4}$ torr. Gases and other materials not deposited upon substrate 12 may be pumped out of reactor chamber 26 through an exhaust 34.

Effusion cell 28 may be housed within reactor chamber 26 and disposed proximate plasma source 24. Effusion cell 28 comprises a crucible 30 operable to contain a metallic charge 32. Effusion cell 28 functions to vaporize the metallic charge 32 within crucible 30. Metallic charge 32 may comprise any suitable metal, such as aluminum or zinc, and can be in the form of a single piece of material or a plurality of pieces.

System 10 can be used to produce piezoelectric layers on a substrate 12 at high deposition rates, such as in the range of 500–5000 nanometers per hour. These piezoelectric layers having improved texture as compared to piezoelectric layers produced without the addition of noble gas. In fact, the texture of piezoelectric layers formed according to the present invention may have (002) x-ray diffraction peak intensities several times greater than (002) x-ray diffraction peak intensities of piezoelectric layers formed without the addition of noble gas. This indicates that piezoelectric layers of the present invention have a much higher degree of C-axis orientation texture normal to a substrate surface. Accordingly, the piezoelectric layers of the present invention are more useful in such electronic applications as thin film resonator filters.

FIG. 2 is a flow diagram of a method 100 for producing piezoelectric layers having improved texture. Method 100 corresponds to the operation of system 10 illustrated and described above with reference to FIG. 1.

Method 100 begins at step 102 where substrate 12 is disposed within reactor chamber 26 of reactor 18. Substrate 12 may be a polymer or organic substrate, or formed from an inorganic substrate material, such as silicon, gallium arsenide, or sapphire.

A metallic charge 32 is disposed within crucible 30 of effusion cell 28. As described above, metallic charge 32 may comprise any suitable material, such as aluminum or zinc for the growth of aluminum nitride or zinc oxide, respectively. At step 104, the material of metallic charge 32 is evaporated within effusion cell 28.

At step 106, the noble gas and the reactant gas are combined. More specifically, reactant gas can be released into line 20, preferably at a rate in the range of 5 to 20 standard cubic centimeters per minute, from reactant gas source 14. Noble gas may be released into line 20 via line 22, preferably at a rate in the range of 0.5 to 5.0 standard cubic centimeters per minute, from noble gas source 16. The reactant gas can be any suitable gas for forming a piezoelectric layer, such as, for example, nitrogen or oxygen for the deposition of aluminum nitride or zinc oxide, respectively. This reactant gas can be in molecular form. The noble gas may be any suitable gas from the noble gas group, such as argon.

At step 108, an atomic reactant gas flow is generated using plasma source 24. In particular, plasma source 24 decomposes the molecules of the reactant gas into atoms. For example, if the reactant gas comprises nitrogen, molecular nitrogen molecules $N_2$ are each decomposed into two nitrogen atoms N. Likewise, if the reactant gas comprises oxygen, molecular oxygen molecules $O_2$ are each decomposed into two oxygen atoms. The addition of the noble gas may enhance the decomposition efficiency of the molecular reactant gas. Various ionized particles may also be produced. These ionized particles may include ionized atoms of noble gas.

It should be understood that the combination of the noble and reactant gases at step 106 and the generation of the atomic reactant gas flow at step 108 may occur in parallel with the evaporation of metallic charge at step 104.

At step 110, the atomic reactant gas flow generated by plasma source 24 is introduced to the evaporated metallic material from effusion cell 28 in the presence of substrate 12 within reactor chamber 26. This introduction may occur in high vacuum and at low pressure, such as in the range of $10^{-7}$ to $10^{-4}$ torr, so that the atomic gas flow reaches substrate 12 without reacting with other materials in reactor chamber 26 until it reaches substrate 12. Furthermore, the temperature of substrate 12 may be in the range of 25–500° C. At substrate 12, it is possible that ionized particles of noble gas may increase mobility of atoms on the surface of substrate, these atoms including the atoms from the atomic gas flow and/or the atoms of the evaporated metallic material. In any event, the atomic reactant gas flow reacts with the evaporated metallic material to form a piezoelectric layer having improved texture. This formation may occur at a relatively high deposition rate, such as in the range of 500–5000 nanometers per hour.

Although the present invention and its advantages have been described in detail, it should be understood that various changes, substitutions, and alterations can be made herein without departing from the spirit and scope of the invention as defined by the appended claims.

What is claimed is:

1. A method of forming a piezoelectric layer, comprising the steps of:

evaporating a metallic material, said metallic material comprised of aluminum;

combining a noble gas with a reactant gas, said reactant gas comprised of nitrogen;

generating an atomic reactant gas flow from the combined gas using a plasma source; and introducing the atomic reactant gas flow to the evaporated metallic material in the presence of a substrate under molecular flow pressure conditions to form a piezoelectric layer, wherein said substrate is at a temperature of around 25 to 300° C.

2. The method of claim 1, wherein the noble gas comprises argon.

3. The method of claim 1, wherein the reactant gas has a flow rate within the range of 5 to 20 standard cubic centimeters per minute.

4. The method of claim 1, wherein the noble gas has a flow rate within the range of 0.5 to 5.0 standard cubic centimeters per minute.

5. The method of claim 1, wherein the step of introducing the atomic reactant gas flow to the evaporated metallic material comprises the step of introducing the atomic reactant gas flow in a molecular flow pressure regime.

6. The method of claim 1, wherein the step of introducing the atomic reactant gas flow to the evaporated metallic material occurs at a pressure in the range of $10^{-7}$ to $10^{-4}$ torr.

7. A method of forming a piezoelectric layer, comprising the steps of:

providing a substrate in a reactor chamber, wherein said substrate is at a temperature of around 25 to 300° C.;

evaporating a metallic material, said metallic material comprised of aluminum;

combining a noble gas with a reactant gas, said reactant gas comprised of nitrogen;

generating an atomic reactant gas flow from the combined gas using a plasma source; and introducing the atomic reactant gas flow to the evaporated metallic material within the reactor chamber at a pressure in the range of $10^{-7}$ to $10^{-4}$ torr to form a piezoelectric layer on the substrate.

8. The method of claim 7, wherein the noble gas has a flow rate in the range of 0.5 to 5.0 standard cubic centimeters per minute.

9. The method of claim 7, wherein the reactant gas has a flow rate in the range of 5 to 20 standard cubic centimeters per minute.

* * * * *